US012696576B2

(12) United States Patent
Huang et al.

(10) Patent No.: US 12,696,576 B2
(45) Date of Patent: Jul. 28, 2026

(54) SEMICONDUCTOR DEVICE

(71) Applicant: LandMark Optoelectronics Corporation, Tainan City (TW)

(72) Inventors: Hung-Wen Huang, Tainan City (TW);
Yung-Chao Chen, Tainan City (TW);
Yi-Hsiang Wang, Tainan City (TW);
Wei Lin, Tainan City (TW)

(73) Assignee: LANDMARK OPTOELECTRONICS CORPORATION, Tainan City (TW)

( * ) Notice: Subject to any disclaimer, the term of this patent is extended or adjusted under 35 U.S.C. 154(b) by 355 days.

(21) Appl. No.: 18/593,512

(22) Filed: Mar. 1, 2024

(65) Prior Publication Data

US 2024/0297261 A1 Sep. 5, 2024

(30) Foreign Application Priority Data

Mar. 2, 2023 (TW) ................................. 112107527

(51) Int. Cl.
*H10F 77/30* (2025.01)
*H10F 77/14* (2025.01)

(52) U.S. Cl.
CPC ....... *H10F 77/334* (2025.01); *H10F 77/1468* (2025.01)

(58) Field of Classification Search
CPC ........................... H10F 77/334; H10F 77/1468
USPC ........................................................ 257/28
See application file for complete search history.

(56) References Cited

U.S. PATENT DOCUMENTS

| | | | |
|---|---|---|---|
| 2005/0184308 A1 | 8/2005 | Dutta | |
| 2012/0274771 A1 | 11/2012 | Nagai et al. | |
| 2014/0264274 A1* | 9/2014 | Nakayama | H10D 62/8164 |
| | | | 257/20 |
| 2015/0206692 A1* | 7/2015 | Liu | H01J 1/312 |
| | | | 257/10 |
| 2018/0151762 A1* | 5/2018 | Huang | H10H 20/824 |

FOREIGN PATENT DOCUMENTS

CN 107180890 A 9/2017

OTHER PUBLICATIONS

Search Report appended to an Office Action, which was issued to Taiwanese counterpart application No. 112107527 by the TIPO on Nov. 29, 2023, with an English translation thereof.

* cited by examiner

*Primary Examiner* — Xia L Cross
(74) *Attorney, Agent, or Firm* — HSML P.C.

(57) ABSTRACT

A semiconductor device includes a substrate, a buffer layer, a gradient layer, an active layer, a window layer, and an optical filtering layer. The substrate includes a first element and a second element. The buffer layer is disposed on the substrate. The gradient layer is formed on the buffer layer, and includes sublayers. Each sublayer includes the first, second, and third elements. For each sublayer, a lattice constant thereof is adjusted by changing a ratio of the second element to the third element. The active layer is formed on the gradient layer, and includes the first, second, and third elements. The window layer is formed on the active layer. The optical filtering layer includes the first, second, and third elements, and is formed on the window layer to block a portion of light having a wavelength in a predetermined wavelength range.

15 Claims, 5 Drawing Sheets

SEMICONDUCTOR DEVICE

CROSS-REFERENCE TO RELATED APPLICATION

This application claims priority to Taiwanese Invention Patent Application No. 112107527, filed on Mar. 2, 2023, the entire disclosure of which is incorporated by reference herein.

FIELD

The disclosure relates to an electronic device, and more particularly to a semiconductor device.

BACKGROUND

Referring to FIG. 1, a conventional semiconductor photodetector 1 is manufactured by a molecular beam epitaxy (MBE) process. The conventional semiconductor photodetector 1 includes a substrate 11, a buffer layer 12 formed on the substrate 11, a quantum well layer 13 formed on the buffer layer 12, an absorption layer 14 formed on the quantum well layer 13, and a window layer 15 formed on the absorption layer 14 and having a light entering opening (not shown). During operation of the semiconductor photodetector 1, the absorption layer 14 absorbs light energy of light entering from the light entering opening of the window layer 15 so as to transmit the light energy to the quantum well layer 13. According to a bandgap value of its material composition, the quantum well layer 13 receives the light energy to generate an energy level transition, thereby generating an electrical signal corresponding to the light energy received by the quantum well layer 13. The electrical signal generated may then be substituted into a formula and be converted so as to obtain a value of the light energy, thereby achieving the purpose of detecting the light energy.

Referring to FIGS. 1 and 2, when the semiconductor photodetector 1 operates at a specific wavelength range that generates a better responsivity, the semiconductor photodetector 1 may perform precise light detection. However, in actual practice, the semiconductor photodetector 1 may often be employed in an environment having natural light (i.e., sunlight) and moisture. Since the natural light received by the semiconductor photodetector 1 has a wavelength range broader than the aforesaid specific wavelength range, the semiconductor photodetector 1 is likely to produce a high responsivity in a wavelength range outside the specific wavelength (as shown in FIG. 2). As a result, the semiconductor photodetector 1 does not perform light detection as expected.

SUMMARY

Therefore, an object of the disclosure is to provide a semiconductor device that can alleviate at least one of the drawbacks of the prior art.

According to the disclosure, the semiconductor device includes a substrate, a buffer layer, a gradient layer, an active layer, a window layer, and an optical filtering layer.

The substrate includes a first element and a second element.

The buffer layer is disposed on the substrate.

The gradient layer is formed on the buffer layer, and includes a plurality of sublayers. Each of the sublayers includes the first element, the second element, and a third element. For each of the sublayers, a lattice constant thereof is adjusted by changing a ratio of the second element to the third element.

The active layer is formed on the gradient layer, and includes the first element, the second element, and the third element. A lattice constant of the active layer is greater than the lattice constant of each of the sublayers of the gradient layer.

The window layer is formed on the active layer.

The optical filtering layer includes the first element, the second element, and the third element, and is formed on the window layer to block a portion of light having a wavelength in a predetermined wavelength range.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

DETAILED DESCRIPTION

Figure 1:
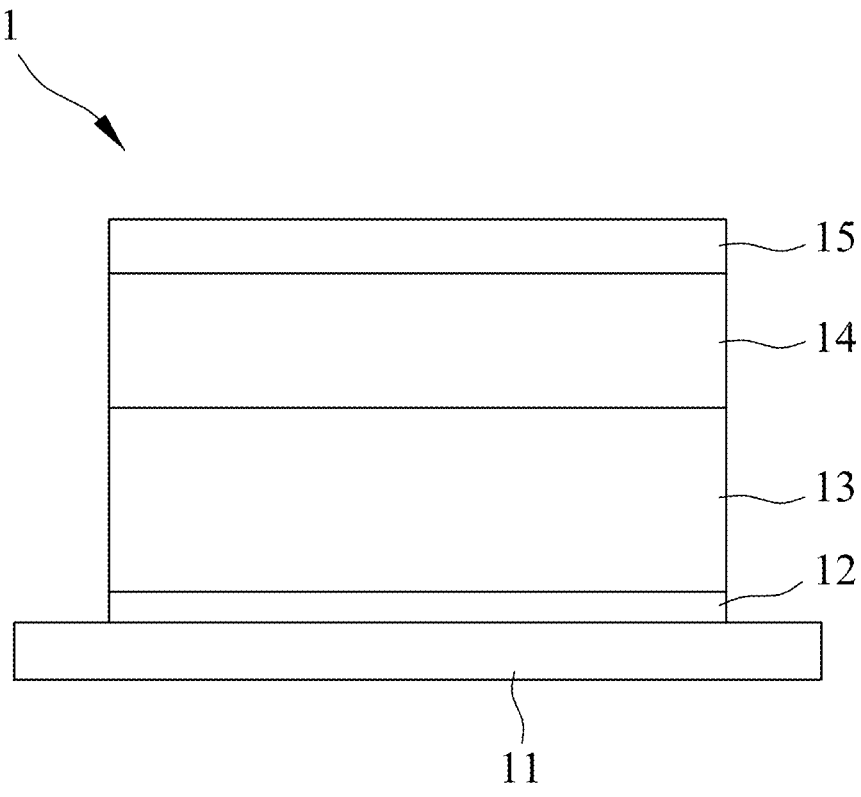
FIG. 1 is a schematic view illustrating a conventional semiconductor photodetector.
Figure 2:
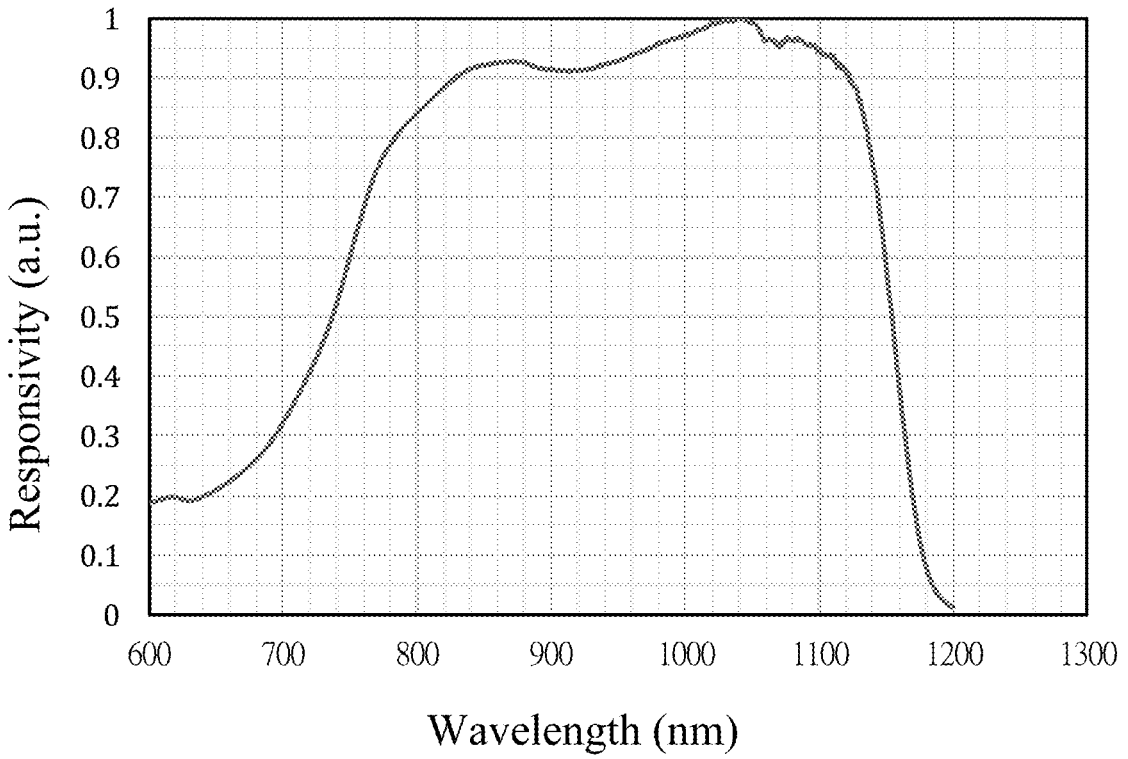
FIG. 2 is graph showing a relationship between responsivity and wavelength, which illustrates a situation where light detection is affected by absorbed wavelength when the conventional semiconductor photodetector is in operation.

Before the disclosure is described in greater detail, it should be noted that where considered appropriate, reference numerals or terminal portions of reference numerals have been repeated among the figures to indicate corresponding or analogous elements, which may optionally have similar characteristics.

It should be noted herein that for clarity of description, spatially relative terms such as "top," "bottom," "upper," "lower," "on," "above," "over," "downwardly," "upwardly" and the like may be used throughout the disclosure while making reference to the features as illustrated in the drawings. The features may be oriented differently (e.g., rotated 90 degrees or at other orientations) and the spatially relative terms used herein may be interpreted accordingly.

Figure 3:
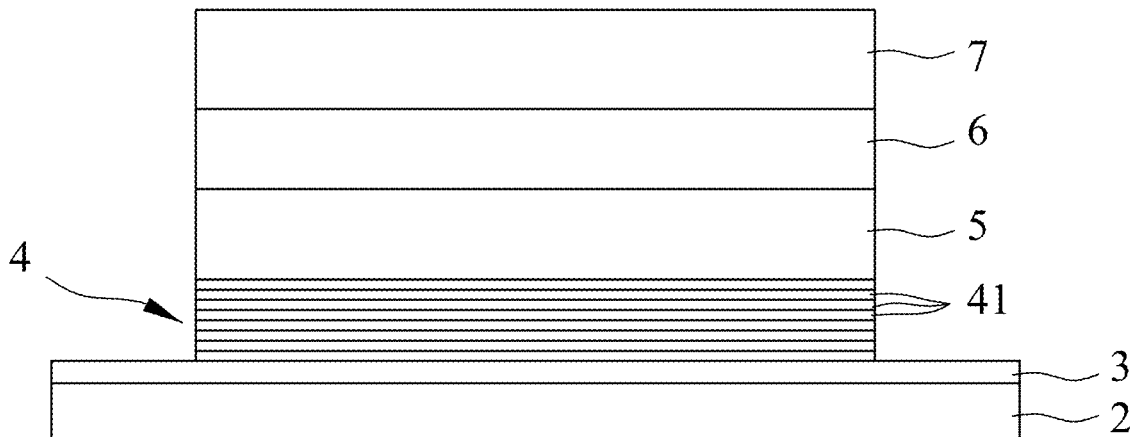
FIG. 3 is a schematic view illustrating a first embodiment of a semiconductor device according to the present disclosure.

Referring to FIG. 3, a first embodiment of a semiconductor device according to the present disclosure includes a substrate 2 including a first element and a second element that may be different from the first element, a buffer layer 3 disposed on the substrate 2, a gradient layer 4 formed on the buffer layer 3, an active layer 5 formed on the gradient layer 4, a window layer 6 formed on the active layer 5, and an optical filtering layer 7 formed on the window layer 6. It should be noted that, in the first embodiment, the first element is arsenic and the second element is gallium. That is to say, in the first embodiment, the substrate 2 is made of a gallium arsenide material, but is not limited thereto in practice.

The gradient layer 4 includes a plurality of sublayers 41. Each of the sublayers 41 includes the first element, the second element, and a third element that may be different from the first and second elements. It should be noted that a ratio of the second element to the third element of each of the sublayers 41 is different. In this embodiment, the ratio may be an atomic ratio. For each of the sublayers 41, a lattice constant thereof is adjusted by changing the ratio of the second element and the third element, so as to make the lattice constant of each of the sublayers 41 to be greater than a lattice constant of the substrate 2. In the first embodiment, the third element is indium, but is not limited thereto in actual practice.

The active layer 5 includes the first element, the second element, and the third element. A lattice constant of the active layer 5 is greater than the lattice constant of each of the sublayers 41 of the gradient layer 4.

Specifically, the material contents of indium and gallium in the sublayers 41 respectively increase and decrease in a gradual manner, or respectively decrease and increase in a gradual manner, in a direction from the substrate 2 to the active layer 5, such that the lattice constants of the sublayers 41 (made of, e.g., InGaAs) gradually vary between the lattice constant (a base value) of the substrate 2 (made of, e.g., GaAs) to the lattice constant (a predetermined value) of the active layer 5 (made of, e.g., InGaAs), thereby eliminating the lattice mismatch between the buffer layer 3 and the active layer 5 and optimizing the epitaxial quality of the active layer 5. The active layer 5 functions to receive a light energy to be detected and generate an electrical signal corresponding to the light energy. By virtue of the optimized epitaxial quality of the active layer 5, the performance of light detection of the semiconductor device may be improved.

Figure 4:
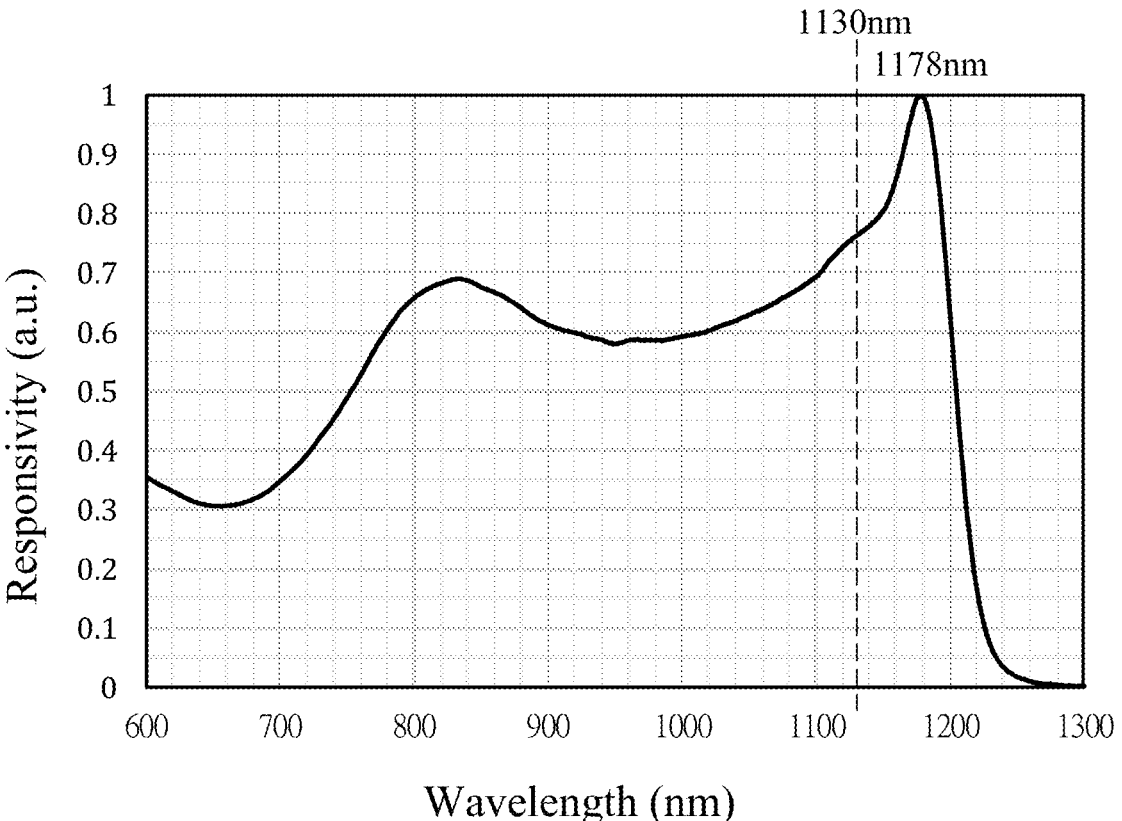
FIG. 4 is a graph showing a relationship between responsivity and wavelength, which illustrates that the first embodiment of the semiconductor device of the present disclosure achieves good light detection when in operation.

The optical filtering layer 7 includes the first element, the second element, and the third element. By varying the ratio of the second element to the third element of the optical filtering layer 7, a portion of a first light having a wavelength set in a predetermined wavelength range is blocked. In some embodiments, the optical filtering layer 7 has a thickness ranging from 1.5 μm and 4.0 μm; the ratio of the second element to the third element in the optical filtering layer 7 is (1-X):X, and X ranges from 0.20 to 0.25. It should be noted that by virtue of varying the ratio of the second element to the third element in the optical filtering layer 7, a band gap of the optical filtering layer 7 is adjusted, thereby absorbing the first light having the wavelength set in the predetermined wavelength range and allowing a second light outside the predetermined wavelength range to transmit the optical filtering layer 7. In the case where the light to be detected is 1130 nm, the thickness of the optical filtering layer 7 is 2 μm, and X is 0.22. That is to say, the optical filtering layer 7 has a composition represented by $In_{0.22}Ga_{0.78}As$ with a thickness of 2 μm. As shown in FIG. 4, the optical filtering layer 7 mainly blocks a light (i.e., the first light) having a wavelength ranging from 850 nm to 1100 nm (i.e., the predetermined wavelength range) so as to prevent the active layer 5 from producing a high responsivity to the first light, thereby ensuring the active layer 5 generates a superior responsivity within a to-be-detected wavelength range (e.g., from 1100 nm to 1200 nm) and thus performs effective light detection.

Referring again to FIG. 3, a second embodiment of the semiconductor device of the present disclosure is substantially the same as the first embodiment, but the difference between the first and second embodiments is that, in the second embodiment, the optical filtering layer 7 further includes a fourth element that is different from the first, second and third elements. In the present disclosure, the fourth element is aluminum for example, but is not limited thereto in practice. Furthermore, a ratio of the second element to the third element to the fourth elements of the light filter layer 7 is (1-X-Y):X:Y, where X ranges from 0.20 to 0.25, and Y is not greater than 0.05. Specifically, the optical filtering layer 7 is a quaternary compound, InAl-GaAs, which consists of four elements.

Figure 5:
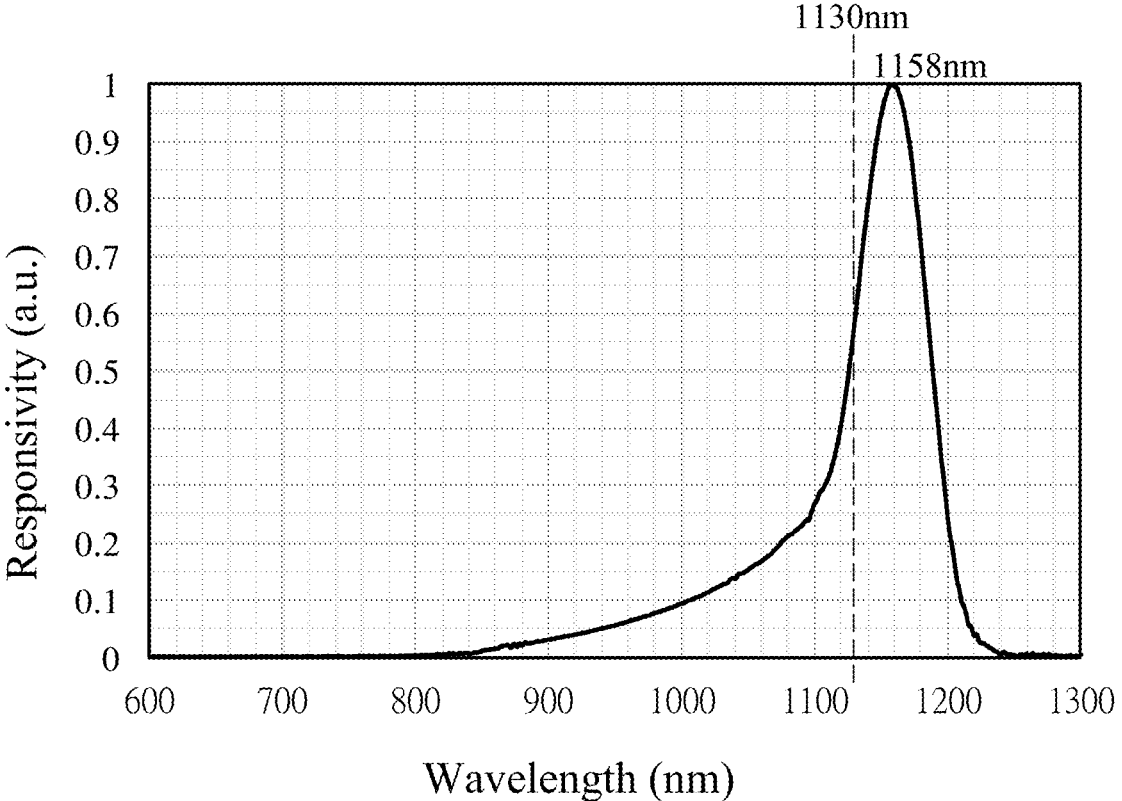
FIG. 5 is a graph showing a relationship between responsivity and wavelength, which illustrates that a second embodiment of the semiconductor device of the present disclosure achieves good light detection when in operation.

In the second embodiment, in the case where the light to be detected is also 1130 nm, X of the optical filtering layer 7 is 0.24, and Y of the light filter layer 7 is 0.025. That is to say, the optical filtering layer 7 is a quaternary compound represented by $In_{0.24}Al_{0.025}Ga_{0.735}As$. As shown in FIG. 5, in the to-be-detected wavelength range (i.e., from 1100 nm to 1200 nm), a superior responsivity is produced, thereby ensuring the active layer 5 achieves better light detection.

In summary, by virtue of disposing the optical filtering layer 7 on the window layer 6 of the semiconductor device, and by virtue of varying the ratio of the second element, the third element, and the fourth element of the optical filtering layer 7, the first light with the predetermined wavelength range that may interfere with the responsivity is blocked, and the second light to be detected by the active layer 5 is transmitted. When the light detection is performed in an environment having interferences, responsivity may still be generated as expected in a desired wavelength range (i.e., to-be-detected wavelength range), thereby ensuring light detection to be performed as expected. Therefore, the object of the disclosure is achieved.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is(are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A semiconductor device, comprising:

a substrate that includes a first element and a second element;

a buffer layer disposed on said substrate;

a gradient layer formed on said buffer layer, and including a plurality of sublayers, each of said sublayers including said first element, said second element, and a third element, wherein, for each of said sublayers, a lattice constant thereof is adjusted by changing a ratio of said second element to said third element;

an active layer formed on said gradient layer, and including said first element, said second element, and said third element, a lattice constant of said active layer being greater than said lattice constant of each of said sublayers of said gradient layer;

a window layer formed on said active layer, and an optical filtering layer including said first element, said second element, and said third element, and formed on said window layer to block a portion of light having a wavelength in a predetermined wavelength.

2. The semiconductor device as claimed in claim 1, wherein said first element is arsenic, and said second element is gallium.

3. The semiconductor device as claimed in claim 2, wherein said third element is indium.

4. The semiconductor device as claimed in claim 3, wherein the ratio of said second element to said third element in said optical filtering layer is (1-X):X, and X ranges from 0.20 to 0.25.

5. The semiconductor device as claimed in claim 3, wherein said optical filtering layer further includes a fourth element, a ratio of said second element to said third element to said fourth element being (1-X-Y):X:Y, X ranging from 0.20 to 0.25, Y being no greater than 0.05.

6. The semiconductor device as claimed in claim 5, wherein said fourth element is aluminum.

7. The semiconductor device as claimed in claim 1, wherein the ratio of said second element to said third element in said optical filtering layer is (1-X):X, and X ranges from 0.20 to 0.25.

8. The semiconductor device as claimed in claim 1, wherein said optical filtering layer further includes a fourth element, a ratio of said second element to said third element to said fourth element being (1-X-Y):X:Y, X ranging from 0.20 to 0.25, Y being no greater than 0.05.

9. The semiconductor device as claimed in claim 1, wherein said optical filtering layer has a thickness ranging from 1.5 μm to 4.0 μm.

10. The semiconductor device as claimed in claim 1, wherein a ratio of said second element to said third element in each of said sublayers is different.

11. The semiconductor device as claimed in claim 1, wherein in a direction from said substrate to said active layer, contents of said second element in said sublayers change in a gradual manner, and contents of said third element in said sublayers decrease in a gradual manner.

12. The semiconductor device as claimed in claim 11, wherein in said direction from said substrate to said active layer, said contents of said second element in said sublayers increase in a gradual manner, and said contents of said third element in said sublayers decrease in a gradual manner.

13. The semiconductor device as claimed in claim 11, wherein in said direction from said substrate to said active layer, said contents of said second element in said sublayers decrease in a gradual manner, and said contents of said third element in said sublayers increase in a gradual manner.

14. The semiconductor device as claimed in claim 1, said lattice constant of each of said sublayers is greater than a lattice constant of said substrate.

15. The semiconductor device as claimed in claim 1, wherein said lattice constants of said sublayers gradually vary between a lattice constant of said substrate to said lattice constant of said active layer.

* * * * *